(12) United States Patent
Machida

(10) Patent No.: US 9,818,681 B2
(45) Date of Patent: Nov. 14, 2017

(54) WIRING SUBSTRATE

(71) Applicant: SHINKO ELECTRIC INDUSTRIES CO., LTD., Nagano-ken (JP)

(72) Inventor: Yoshihiro Machida, Nagano (JP)

(73) Assignee: Shinko Electric Industries Co., Ltd., Nagano-shi, Nagano-ken (JP)

(*) Notice: Subject to any disclaimer, the term of this patent is extended or adjusted under 35 U.S.C. 154(b) by 78 days.

(21) Appl. No.: 14/969,555

(22) Filed: Dec. 15, 2015

(65) Prior Publication Data

US 2016/0190053 A1 Jun. 30, 2016

(30) Foreign Application Priority Data

Dec. 25, 2014 (JP) ................. 2014-263381

(51) Int. Cl.
*H05K 1/18* (2006.01)
*H01L 23/498* (2006.01)
(Continued)

(52) U.S. Cl.
CPC .... *H01L 23/49827* (2013.01); *H01L 21/4853* (2013.01); *H01L 23/49811* (2013.01); *H01L 23/49822* (2013.01); *H01L 23/49833* (2013.01); *H01L 24/06* (2013.01); *H01L 24/32* (2013.01); *H01L 24/33* (2013.01); *H01L 24/73* (2013.01); *H01L 24/81* (2013.01); *H01L 24/83* (2013.01); *H05K 1/185* (2013.01); *H05K 3/4614* (2013.01); *H01L 23/49816* (2013.01); *H01L 23/49838* (2013.01); *H01L 24/05* (2013.01); *H01L 24/13* (2013.01); *H01L 24/16* (2013.01); *H01L 24/29* (2013.01); *H01L 2224/0401* (2013.01); *H01L 2224/04026* (2013.01); *H01L 2224/05155* (2013.01); *H01L 2224/05166* (2013.01); *H01L 2224/05644* (2013.01); *H01L 2224/05647* (2013.01); *H01L 2224/06183* (2013.01); *H01L 2224/131* (2013.01); *H01L 2224/13111* (2013.01); *H01L 2224/16014* (2013.01); *H01L 2224/16105* (2013.01);
(Continued)

(58) Field of Classification Search
CPC .............................. H05K 1/144; H05K 1/145
USPC ....... 361/760, 761, 763, 764, 766, 767, 768, 361/772, 782, 783, 784, 790
See application file for complete search history.

(56) References Cited

U.S. PATENT DOCUMENTS

2006/0054352 A1* 3/2006 Ryu ........................ H05K 1/185
174/260
2006/0154496 A1* 7/2006 Imamura ................ H05K 1/186
439/66

FOREIGN PATENT DOCUMENTS

WO WO 2007/069606 6/2007

* cited by examiner

*Primary Examiner* — Binh Tran
(74) *Attorney, Agent, or Firm* — Fish & Richardson P.C.

(57) ABSTRACT

A wiring substrate includes a first substrate and an electronic component mounted on an upper surface of the first substrate. A first pad is formed on an uppermost wiring layer of the first substrate. A connection terminal is formed on the electronic component and is located proximate to the first pad in a plan view. The wiring substrate further includes a connection member formed on the first pad to electrically connect the first pad and the connection terminal. The connection member includes a rod-shaped core and a solder layer, which is coated around the core and joined to the first pad. The solder layer includes a bulge that spreads from the core of the connection member in a planar direction. The bulge is joined to the connection terminal of the electronic component.

9 Claims, 11 Drawing Sheets

(51) Int. Cl.
  *H01L 23/00*    (2006.01)
  *H01L 21/48*    (2006.01)
  *H05K 3/46*     (2006.01)
  *H05K 7/00*     (2006.01)

(52) U.S. Cl.
  CPC ........... *H01L 2224/16106* (2013.01); *H01L 2224/16175* (2013.01); *H01L 2224/291* (2013.01); *H01L 2224/2919* (2013.01); *H01L 2224/29111* (2013.01); *H01L 2224/32014* (2013.01); *H01L 2224/32105* (2013.01); *H01L 2224/32106* (2013.01); *H01L 2224/32175* (2013.01); *H01L 2224/32227* (2013.01); *H01L 2224/33183* (2013.01); *H01L 2224/73253* (2013.01); *H01L 2224/81424* (2013.01); *H01L 2224/81444* (2013.01); *H01L 2224/81447* (2013.01); *H01L 2224/81815* (2013.01); *H01L 2224/83101* (2013.01); *H01L 2224/83424* (2013.01); *H01L 2224/83444* (2013.01); *H01L 2224/83447* (2013.01); *H01L 2224/83815* (2013.01); *H01L 2924/15311* (2013.01); *H05K 2201/10303* (2013.01); *H05K 2203/061* (2013.01)

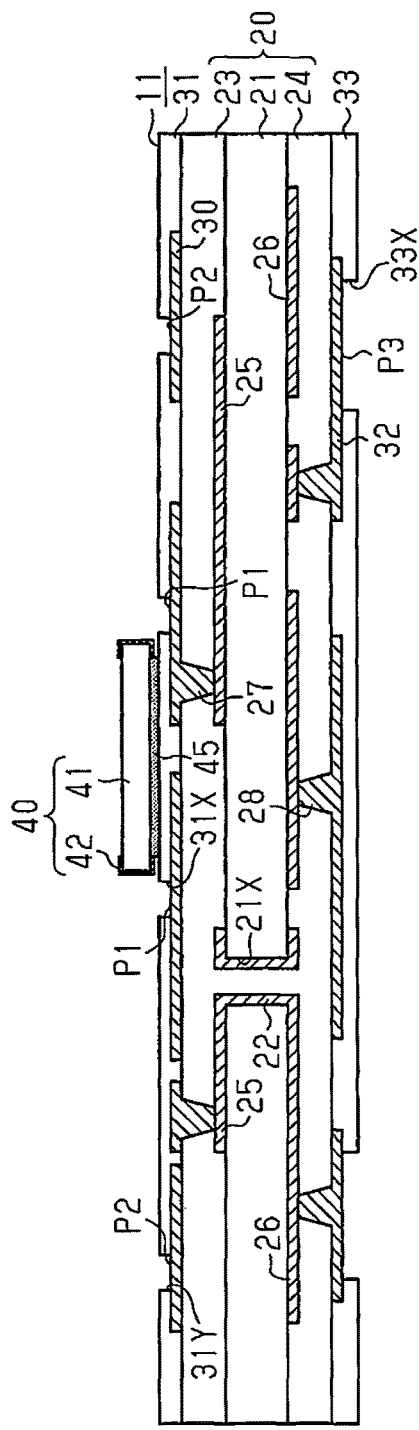
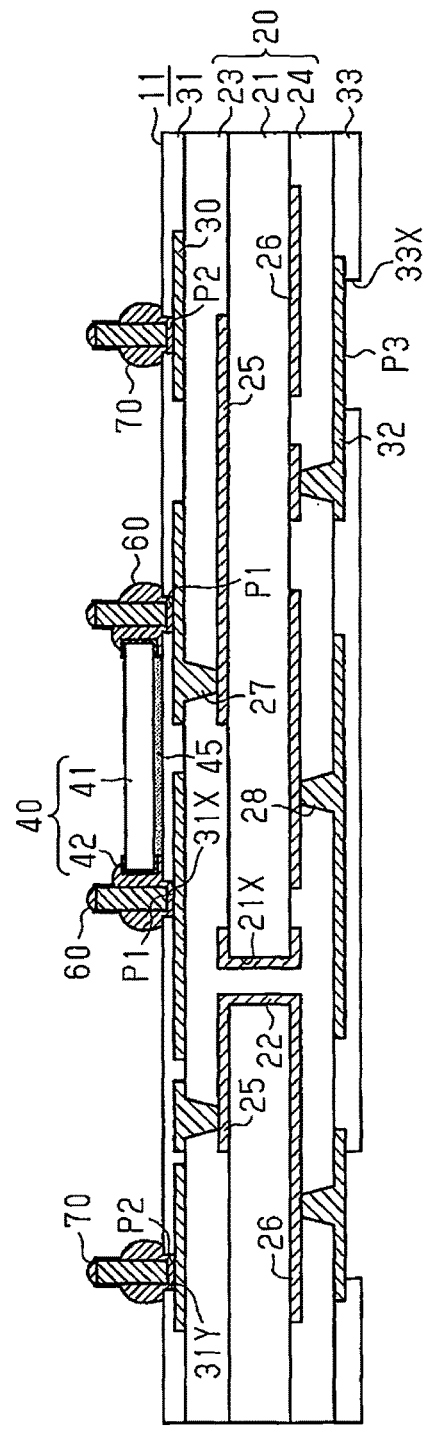
Fig.2A
Fig.2B

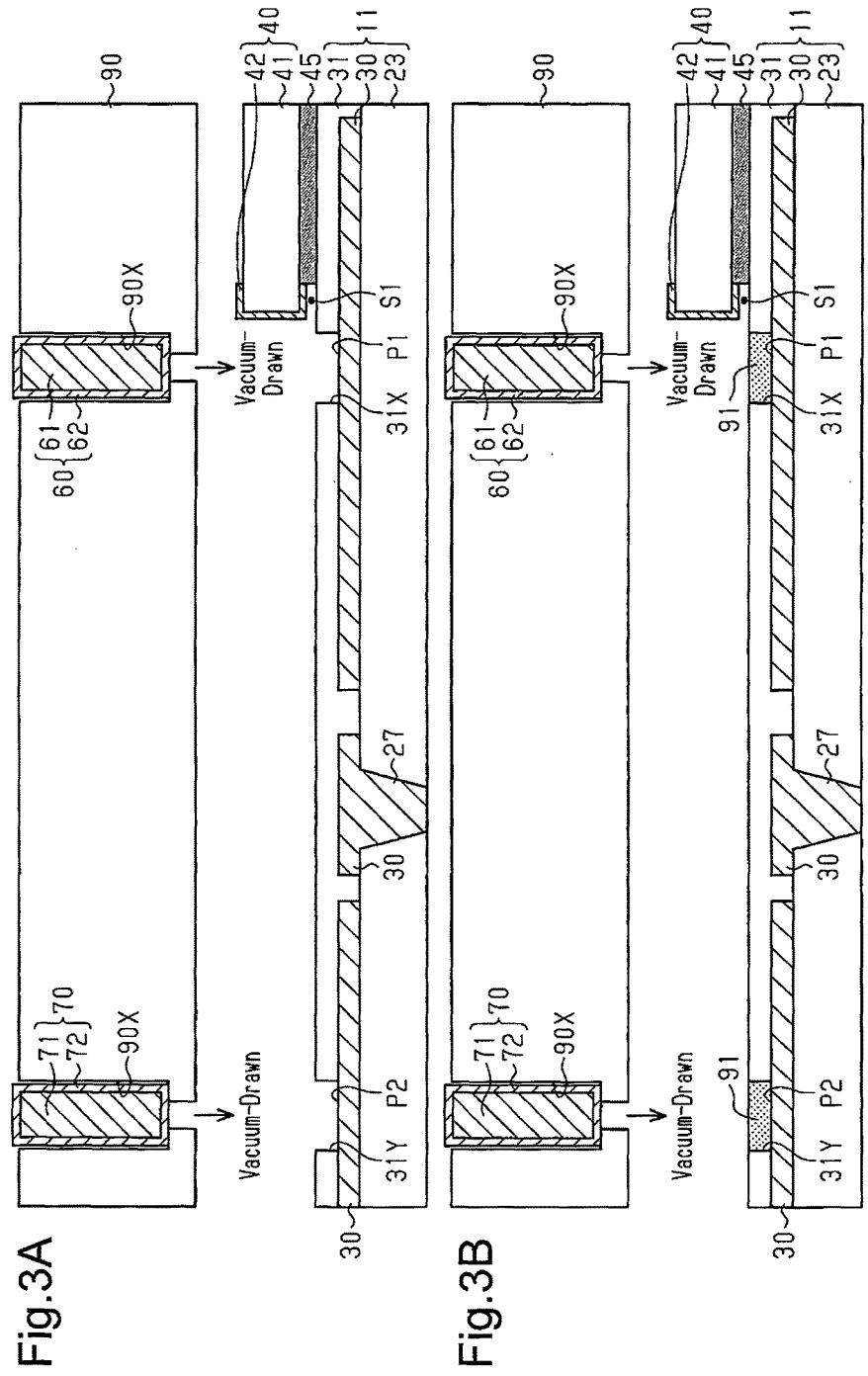

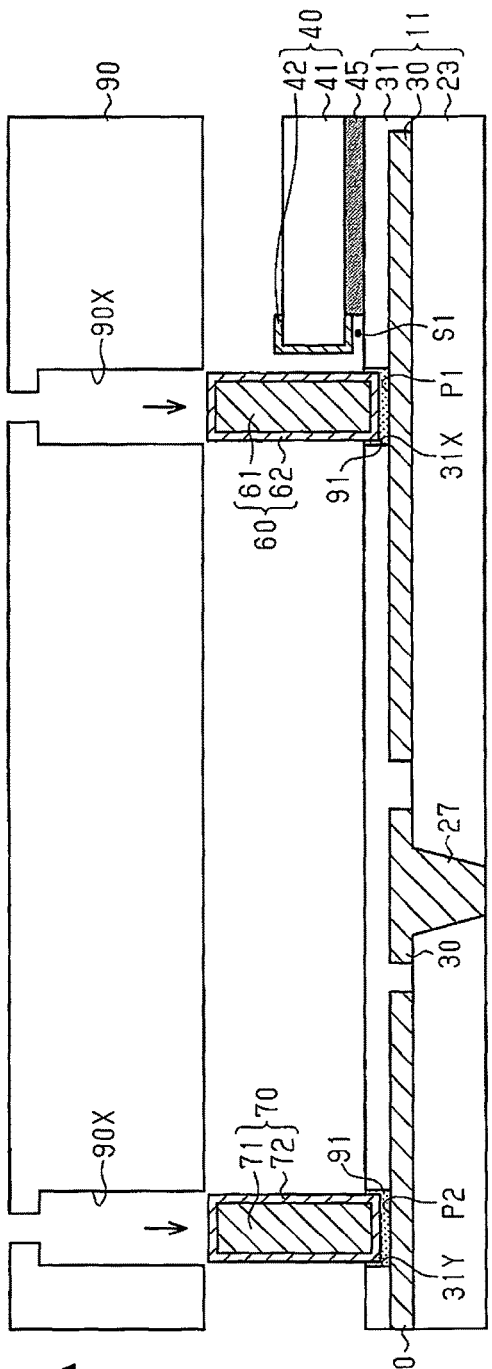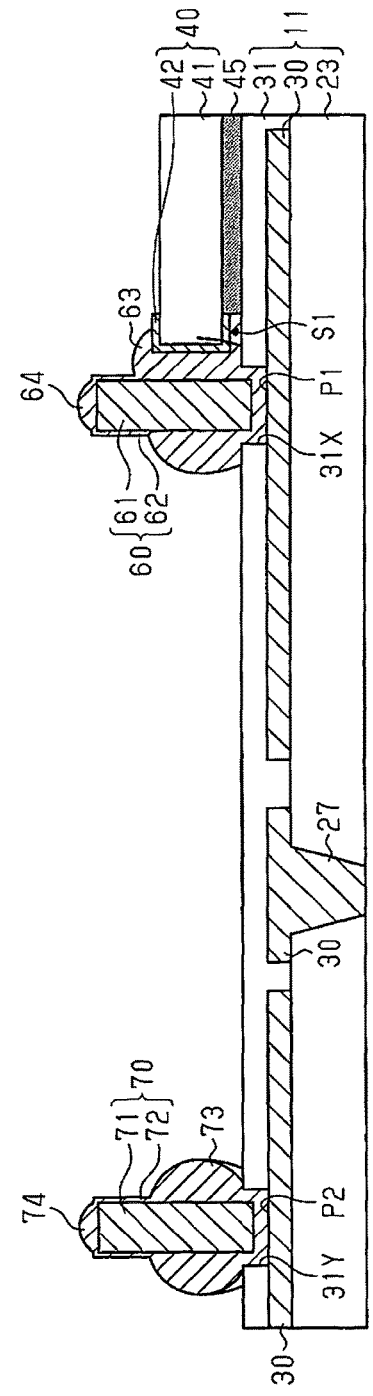
Fig.4A
Fig.4B

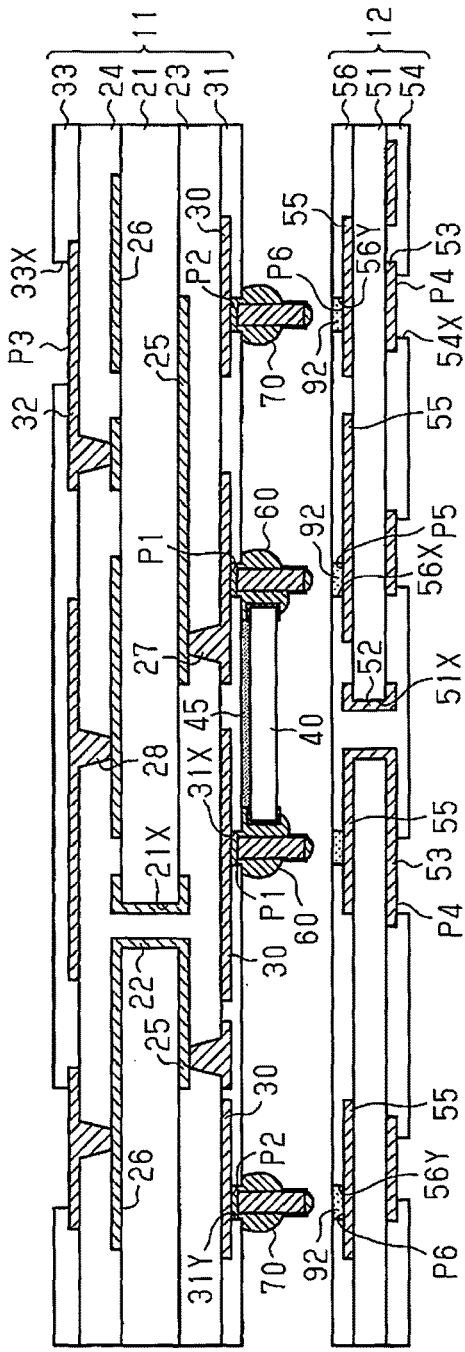
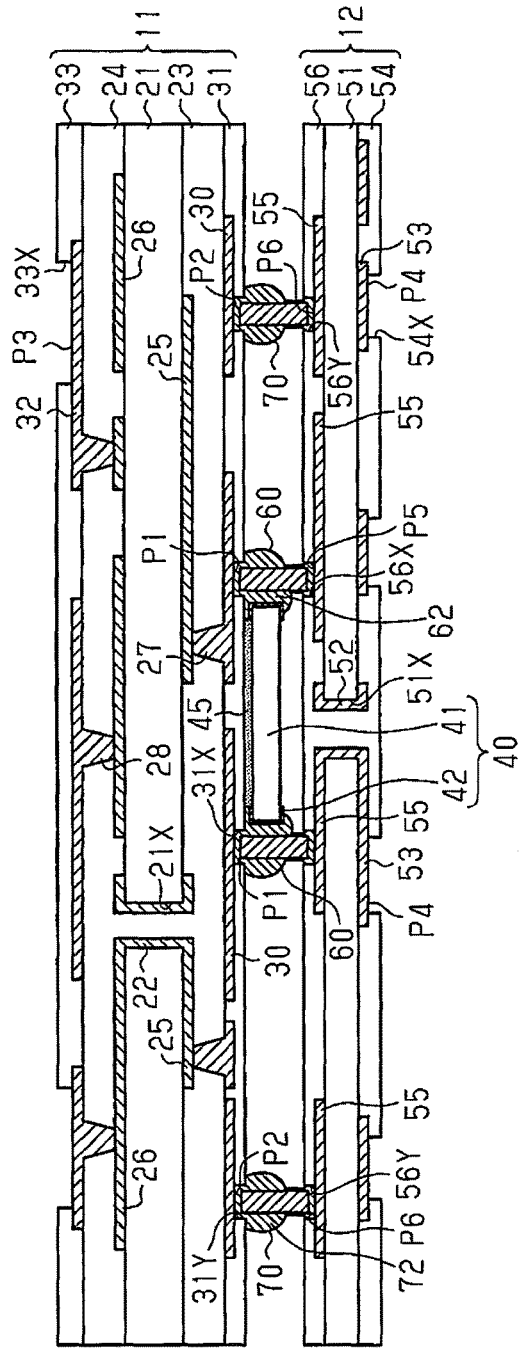
Fig.5A
Fig.5B

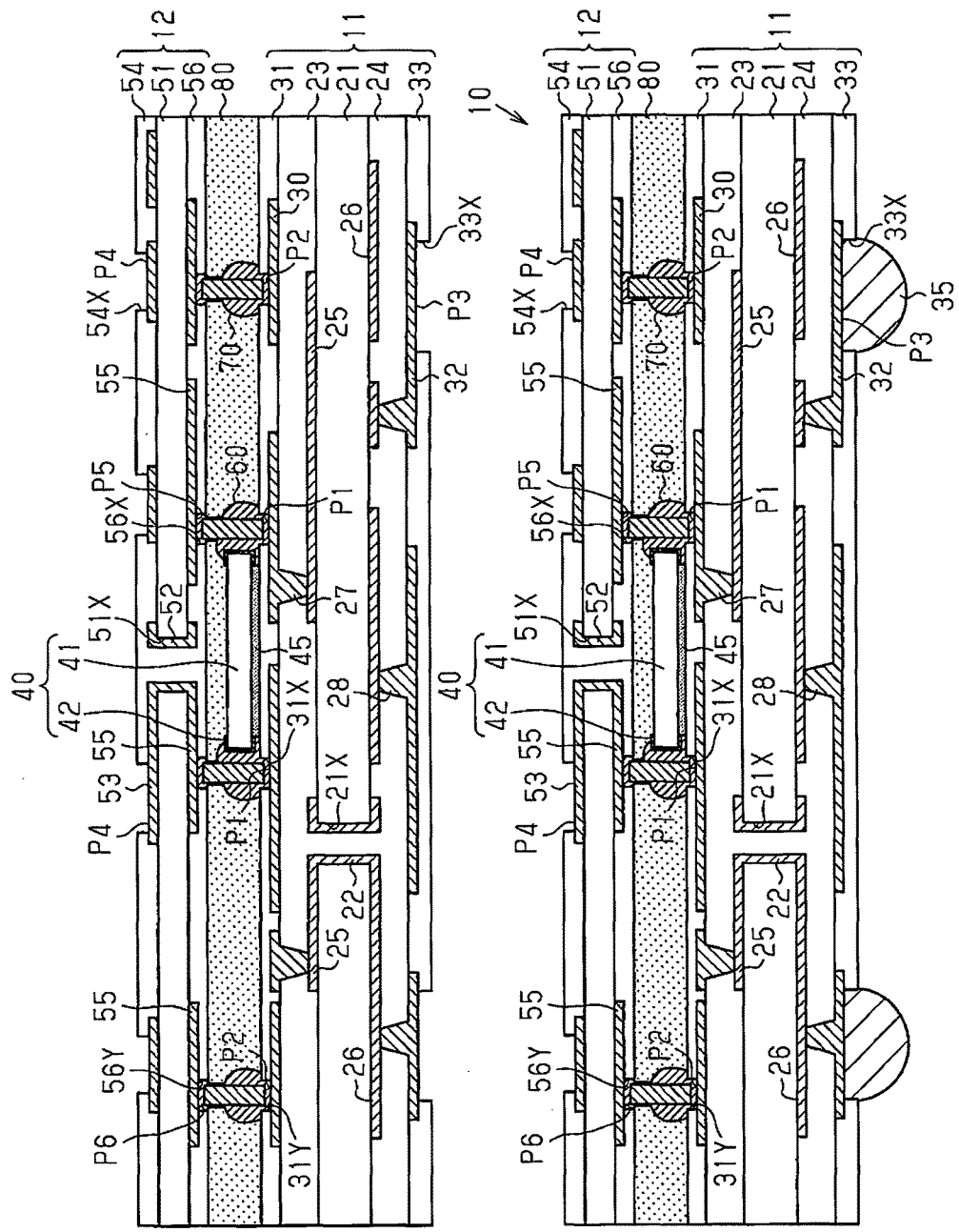

WIRING SUBSTRATE

CROSS-REFERENCE TO RELATED APPLICATIONS

This application is based upon and claims the benefit of priority from prior Japanese Patent Application No. 2014-263381, filed on Dec. 25, 2014, the entire contents of which are incorporated herein by reference.

FIELD

This disclosure relates to a wiring substrate and a method for manufacturing the wiring substrate.

BACKGROUND

International Publication No. WO 2007/069606 describes a wiring substrate that incorporates an electronic component by encapsulating the electronic component in an encapsulation resin between upper and lower substrates. In the wiring substrate, the electronic component is coupled to the lower substrate by wire bonding.

In this wiring substrate, bonding wires electrically connect electrode pads of the electronic component to connection pads of the lower substrate, and wirings extend from the connection pads in the planar direction. The wirings each include a distal end that forms a pad. The pads of the wirings are electrically connected to connection pads of the upper substrate via solder balls or the like. Such a structure increases the wiring length, for example, from the electrode pads of the electronic component to the connection pads of the upper substrate.

SUMMARY

One aspect of this disclosure is a wiring substrate. The wiring substrate includes a first substrate including an uppermost wiring layer, a first pad formed on the uppermost wiring layer of the first substrate, an electronic component mounted on an upper surface of the first substrate, a connection terminal formed on the electronic component and located proximate to the first pad in a plan view, and a connection member formed on the first pad to electrically connect the first pad and the connection terminal. The connection member includes a rod-shaped core and a solder layer. The solder layer is coated around the core and joined to the first pad. The solder layer includes a bulge that spreads from the core of the connection member in a planar direction. The bulge is joined to the connection terminal of the electronic component.

Other aspects and advantages of this disclosure will become apparent from the following description, taken in conjunction with the accompanying drawings, illustrating by way of example the principles of the invention.

It is to be understood that both the foregoing general description and the following detailed description are exemplary and explanatory and are not restrictive of the invention, as claimed.

BRIEF DESCRIPTION OF THE DRAWINGS

The embodiments, together with objects and advantages thereof, may best be understood by reference to the following description of the presently preferred embodiments together with the accompanying drawings in which:

FIGS. 2A, 2B, 3A, 3B, 4A, 4B, 5A, 5B, 6A, and 6B are schematic cross-sectional views illustrating a method for manufacturing the wiring substrate of FIG. 1A;

DESCRIPTION OF THE EMBODIMENTS

Figures 1A, 1B:
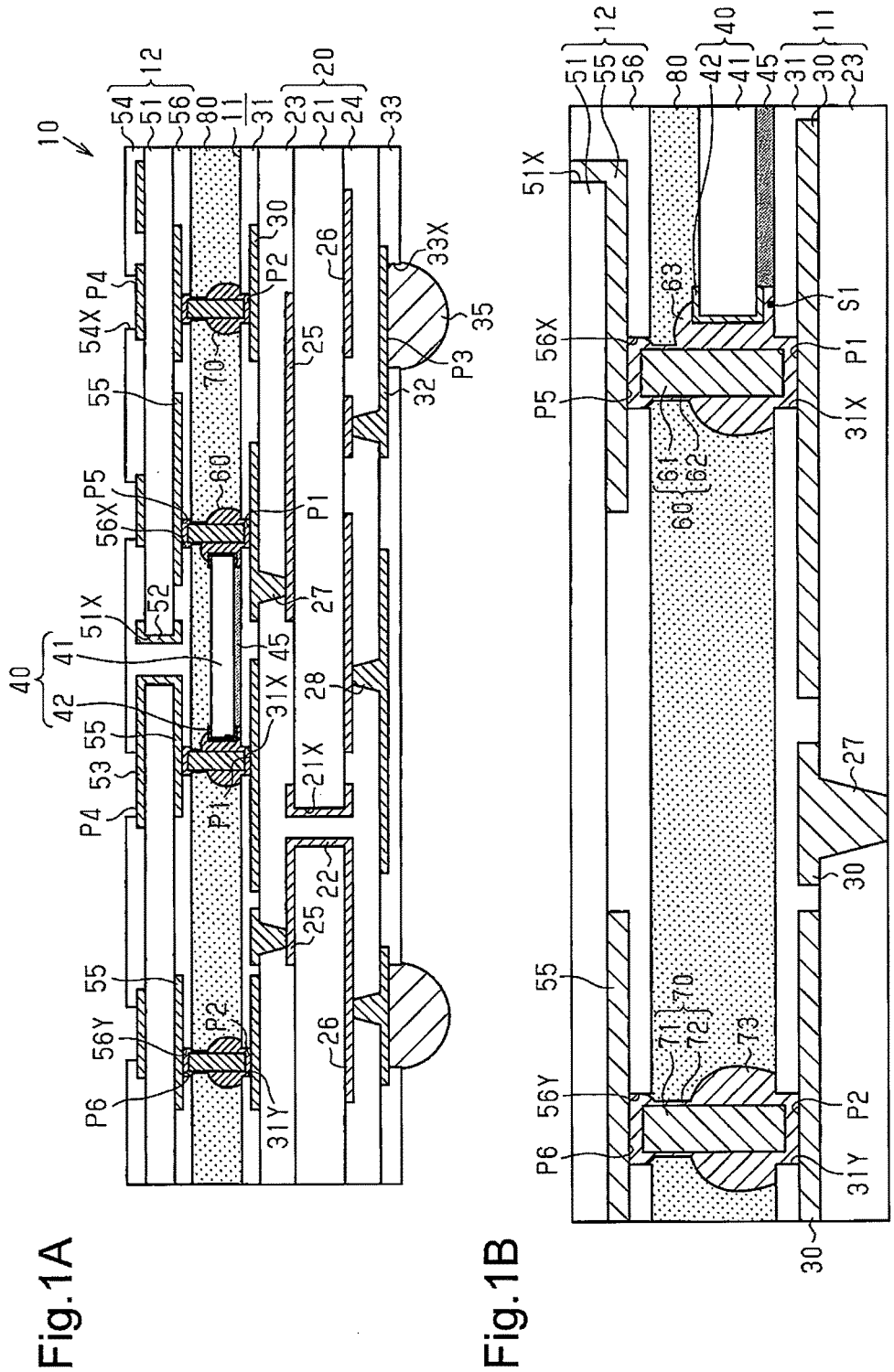
FIG. 1A is a schematic cross-sectional view illustrating one embodiment of a wiring substrate.
FIG. 1B is an enlarged cross-sectional view illustrating a portion of the wiring substrate of FIG. 1A.

One embodiment will now be described with reference to the accompanying drawings. Elements in the drawings are illustrated for simplicity and clarity and have not necessarily been drawn to scale. To facilitate understanding, hatching lines may not be illustrated or be replaced by shadings in the cross-sectional drawings.

The structure of a wiring substrate 10 will now be described.

As illustrated in FIG. 1A, the wiring substrate 10 includes a first substrate 11, a second substrate 12, an electronic component 40, connection members 60, 70, and an encapsulation resin 80. The wiring substrate 10 is an electronic component incorporated type that incorporates the electronic component 40 between the first substrate 11 and the second substrate 12.

The first substrate 11 includes a substrate body 20, wiring patterns 30, a solder resist layer 31, wiring patterns 32, and a solder resist layer 33. The wiring patterns 30 are formed on the uppermost wiring layer of the first substrate 11. The wiring patterns 32 are formed on the lowermost wiring layer of the first substrate 11.

The substrate body 20 includes a core substrate 21, a through electrode 22, which is formed in a through hole 21X of the core substrate 21, an insulation layer 23, which is stacked on an upper surface of the core substrate 21, and an insulation layer 24, which is stacked on a lower surface of the core substrate 21. The substrate body 20 further includes wiring patterns 25, which are formed on the upper surface of the core substrate 21 and covered by the insulation layer 23, via wirings 27, which are formed on the wiring patterns 25, wiring patterns 26, which are formed on the lower surface of the core substrate 21 and covered by the insulation layer 24, and via wirings 28, which are formed on the wiring patterns 26. The through electrode 22, the wiring patterns 25, 26, and the via wirings 27, 28 electrically connect the wiring patterns 30 and the wiring patterns 32. The material of the core substrate 21 may be a so-called glass epoxy resin. For example, a glass cloth (glass woven cloth), which functions as a reinforcement material, is impregnated with a thermosetting insulation resin, the main component of which is an epoxy resin, and cured to form the glass epoxy resin. The material of the insulation layers 23, 24 may be, for example, an insulation resin such as an epoxy resin or a polyimide resin. For example, copper (Cu) or an alloy of copper may be used as the material of the through electrode 22, the wiring patterns 25, 26, and the via wirings 27, 28.

The wiring patterns 30 are formed on the upper surface of the insulation layer 23. More specifically, the wiring patterns 30 are located on a mount surface (here, upper surface) of the substrate body 20 on which the electronic component 40 is mounted. For example, copper or an alloy of copper may be used as the material of the wiring patterns 30. Some of the wiring patterns 30 include component connection pads P1. Each component connection pad P1 is electrically connected to the electronic component 40 via one of the connection members 60. Others of the wiring patterns 30 include connection pads P2. The connection pads P2 are used to electrically connect the first substrate 11 and the second substrate 12. The component connection pads P1 are shaped, for example, in correspondence with the shape of electrode terminals 42 of the electronic component 40. The connection pads P2 are arranged, for example, in one or more rows (here, one row) along the periphery of the insulation layer 23. Each of the component connection pads P1 and the connection pads P2 is, for example, circular in a plan view.

The solder resist layer 31 is located on the upper surface of the insulation layer 23 to partially cover the wiring patterns 30. In other words, the solder resist layer 31 is provided with openings 31X, which expose portions of the wiring patterns 30 as the component connection pads P1, and openings 31Y, which expose other portions of the wiring patterns 30 as the connection pads P2. For example, an insulation resin such as an epoxy resin or an acrylic resin may be used as the material of the solder resist layer 31.

If necessary, a surface-processed layer may be formed on the upper surfaces of the wiring patterns that are exposed from the openings 31X, 31Y, that is, the component connection pads P1 and the connection pads P2. Examples of a surface-processed layer include a gold (Au) layer, a nickel (Ni)/Au layer (a metal layer in which an Ni layer and an Au layer are sequentially stacked), and an Ni/palladium (Pd)/Au layer (a metal layer in which an Ni layer, a Pd layer, and an Au layer are sequentially stacked). The Ni layer, the Au layer, and the Pd layer may be, for example, an electroless plating metal layer, which is formed through an electroless plating process. The Ni layer is a metal layer formed from Ni or an alloy of Ni. The Au layer is a metal layer formed from Au or an alloy of Au. The Pd layer is a metal layer formed from Pd or an alloy of Pd. Additionally, the component connection pads P1 and the connection pads P2 may undergo an oxidization protection process such as an organic solderability preservative (OSP) process to form a surface-processed layer. When an oxidization protection process is performed, an organic film formed from an azole compound, an imidazole compound, or the like is formed as a surface-processed layer on the component connection pads P1 and the connection pads P2.

The wiring patterns 32 are formed on the lower surface of the insulation layer 24. More specifically, the wiring patterns 32 are located on a surface (here, lower surface) of the substrate body 20 that is located at a side opposite to the above mount surface. The wiring patterns 32 include external connection pads P3. The external connection pads P3 include external connection terminals 35, which are used when mounting the wiring substrate 10 on a mount substrate such as a motherboard. Although not illustrated in the drawings, for example, the external connection pads P3 are laid out in a peripheral arrangement in a plan view. Each external connection pad P3 is, for example, circular in a plan view.

The solder resist layer 33 is located on the lower surface of the insulation layer 24 to partially cover the wiring patterns 32. In other words, the solder resist layer 33 is provided with openings 33X, which expose portions of the wiring patterns 32 as the external connection pads P3. For example, an insulation resin such as an epoxy resin or an acrylic resin may be used as the material of the solder resist layer 33.

If necessary, a surface-processed layer may be formed on the upper surfaces of the wiring patterns 32 that are exposed from the openings 33X, that is, the external connection pads P3. Examples of a surface-processed layer include an Au layer, an Ni/Au layer, and an Ni/Pd/Au layer. Additionally, the external connection terminals P3 may undergo an oxidization protection process such as the OSP process to form a surface-processed layer. Here, when the external connection terminals 35 are omitted, the wiring patterns 32 that are exposed from the openings 33X may be used as external connection terminals. Alternatively, when surface-processed layers are formed on the wiring patterns 32, the surface-processed layers may be used as external connection terminals.

The external connection terminals 35 are formed on the external connection pads P3. For example, solder balls or lead pins may be used as the external connection terminals 35. In the present example, solder balls are used as the external connection terminals 35.

The electronic component 40 is mounted on the upper surface (mount surface) of the first substrate 11, which has the structure described above. For example, a chip component may be used as the electronic component 40. One example of the chip component is a chip capacitor. In the present example, a chip capacitor is used as the electronic component 40. In the description, hereafter, the electronic component 40 may be referred to as the chip capacitor 40.

The chip capacitor 40 includes a box-shaped body 41 and two electrode terminals 42, which are formed on two longitudinal ends of the body 41. The two electrode terminals 42 cover opposing side surfaces of the body 41, more specifically, the two longitudinal end surfaces of the body 41. In the present example, each electrode terminal 42 covers one of the side surfaces of the body 41 and partially covers the upper and lower surfaces of the body 41 that are continuous with the corresponding side surface. The chip capacitor 40 is bonded to the first substrate 11. Each electrode terminal 42 is located proximate to the component connection pads P1, P5 in a plan view.

Here, the size of the chip capacitor 40 may be approximately 0.6 mm×0.3 mm to 10 mm×10 mm in a plan view. The thickness of the body 41 may be, for example, approximately 50 to 300 µm. The thickness of the electrode terminals 42 may be, for example, approximately 10 to 50 µm. The body 41 includes, for example, a ceramic, functioning as a main component, and electrodes of copper or the like. For example, a copper or an alloy of copper may be used as the material of the electrode terminals 42. For example, the diameter of the component connection pads P1, which are circular in a plan view, is set to be approximately equal to the length of the longitudinal ends of the chip capacitor 40.

As illustrated in FIG. 1B, the lower surface of the body 41 of the chip capacitor 40 is bonded to the upper surface of the first substrate 11 (in the present example, upper surface of solder resist layer 31) with an adhesion layer 45. For example, the adhesion layer 45 is formed to be thicker than the electrode terminals 42. Thus, a gap S1 is formed between a lower surface of each electrode terminal 42, which is formed on the lower surface of the body 41, and an upper surface of the solder resist layer 31. The thickness of the adhesion layer 45 may be, for example, approximately 20 to 70 μm. For example, a die attach film formed from an epoxy resin may be used as the adhesion layer 45.

The structure of the second substrate 12 will now be described with reference to FIG. 1A.

The second substrate 12 includes a core substrate 51, a through electrode 52, which is formed in a through hole 51X of the core substrate 51, wiring patterns 53, a solder resist layer 54, wiring patterns 55, and a solder resist layer 56. The wiring patterns 53 are formed on the uppermost wiring layer of the second substrate 12. The wiring patterns 55 are formed on the lowermost wiring layer of the second substrate 12. The wiring patterns 53 and the wiring patterns 55 are electrically connected via the through electrode 52. For example, an insulation resin such as a glass epoxy resin may be used as the material of the core substrate 51.

The wiring patterns 53 are formed on an upper surface of the core substrate 51. For example, copper or an alloy of copper may be used as the material of the wiring patterns 53. The wiring patterns 53 include component connection pads P4. The component connection pads P4 are used to electrically connect the electronic component 40 to another electronic component (e.g., semiconductor chip or chip component) or a semiconductor package. Each component connection pad P4 is, for example, circular in a plan view.

The solder resist layer 54 is located on the upper surface of the core substrate 51 to partially cover the wiring patterns 53. In other words, the solder resist layer 54 is provided with openings 54X, which expose portions of the wiring patterns 53 as the component connection pads P4. For example, an insulation resin such as an epoxy resin or an acrylic resin may be used as the material of the solder resist layer 54.

If necessary, a surface-processed layer may be formed on the wiring patterns 53 that are exposed from the openings 54X, that is, the component connection pads P4. Examples of a surface-processed layer include an Au layer, an Ni/Au layer, and an Ni/Pd/Au layer. Additionally, the component connection pads P4 may undergo an oxidation protection process such as the OSP process to form a surface-processed layer.

The wiring patterns 55 are formed on a lower surface of the core substrate 51. For example, copper or an alloy of copper may be used as the material of the wiring patterns 55. Some of the wiring patterns 55 include component connection pads P5. Each component connection pad P5 is electrically connected to one of the component connection pads P1 and one of the electrode terminals 42 via one of the connection members 60. Additionally, others of the wiring patterns 55 include connection pads P6. The connection pads P6 are used to electrically connect the first substrate 11 and the second substrate 12. Each component connection pad P5 is faced toward one of the component connection pads P1. Each connection pad P6 is faced toward one of the connection pads P2. Each of the component connection pads P5 and the connection pads P6 is, for example, circular in a plan view.

The solder resist layer 56 is located on the lower surface of the core substrate 51 to partially cover the wiring patterns 55. In other words, the solder resist layer 56 is provided with openings 56X, which expose portions of the wiring patterns 55 as the component connection pads P5, and openings 56Y, which expose other portions of the wiring patterns 55 as the connection pads P6. For example, an insulation resin such as an epoxy resin or an acrylic resin may be used as the material of the solder resist layer 56.

If necessary, a surface-processed layer may be formed on the wiring patterns 55 that are exposed from the openings 56X, 56Y, that is, the component connection pads P5 and the connection pads P6. Examples of a surface-processed layer include an Au layer, an Ni/Au layer, and an Ni/Pd/Au layer. Additionally, the component connection pads P5 and the connection pads P6 may undergo an oxidization protection process such as the OSP process to form a surface-processed layer.

Each component connection pad P5 is joined to one of the connection members 60. Each connection member 60 is joined to one of the component connection pads P1 of the first substrate 11 and one of the electrode terminals 42 of the electronic component 40.

As illustrated in FIG. 1B, each connection member 60 includes a core 61 and a solder layer 62, which is coated around the core 61. The core 61 extends, for example, in a stacking direction of the first substrate 11 and the second substrate 12 (in FIG. 1B, vertical direction), that is, a direction orthogonal to a planar direction (in FIG. 1B, horizontal direction). The core 61 is a rod-shaped core and has the form of, for example, a round rod or a polygonal rod. The material of the core 61 may be, for example, a metal such as copper, aluminium (Al), or gold, or an alloy containing at least one of the metals.

The solder layer 62 coats the entire outer surface of the core 61. Each solder layer 62 includes a lower end that forms a bulge 63 spreading from the core 61 in the planar direction at a location proximate to the first substrate 11. The bulge 63 (lower end of the solder layer 62) is joined to one of the electrode terminals 42 of the electronic component 40. For example, the bulge 63 includes a curved outer surface that is bulged away from the core 61 so as to be spherical in a side view. The bulge 63 is bulged upward on the upper surface of the solder resist layer 31. The curved outer surface of the bulge 63 is located proximate to the core 61 at positions near the upper surface of the solder resist layer 31 (lower end of core 61) and an intermediate portion of the core 61. Thus, the solder layer 62 includes a straight rod portion, which coats the upper half of the core 61, and the spherical bulge 63, which is continuous with the straight rod portion and coats the lower half of the core 61. The bulge 63 coats surfaces (upper, side, and lower surfaces) of the corresponding electrode terminal 42 and is bulged upward on the upper surface of the electrode terminal 42. Additionally, the bulge 63 fills the gap S1 between the electrode terminal 42 and the solder resist layer 31. The material of the solder layer 62 may be, for example, tin (Sn), an alloy of Sn and Cu, an alloy of Sn and silver (Ag), or an alloy of Sn, Ag, and Cu.

The solder layer 62 coats an upper end surface of the core 61 and is joined to the corresponding component connection pad P5. For example, the solder layer 62 coats the upper end surface of the core 61 to fill the corresponding opening 56X of the solder resist layer 56. The solder layer 62 also coats a lower end surface of the core 61 and is joined to the corresponding component connection pad P1. For example, the solder layer 62 coats the lower end surface of the core 61 to fill the corresponding opening 31X of the solder resist layer 31. The bulge 63 of the solder layer 62 is joined to one of the electrode terminals 42 of the chip capacitor 40. Thus, each electrode terminal 42 is electrically connected to the component connection pads P1, P5 via the connection member 60. In other words, the electrode terminal 42 is electrically connected to the component connection pads P1, P5 without connecting the electrode terminal 42 and the component connection pad P1 by bonding wires nor extending wirings from the component connection pad P1 in the planar direction. In this manner, each connection member 60 functions as a connection terminal that electrically connects the electrode terminal 42 and the component connection pads P1, P5. Each connection member 60 also functions as a spacer that maintains a distance (separation distance) between the first substrate 11 and the second substrate 12 at a predetermined value. In the connection members 60 of the present example, the solder layers 62 function as connection terminals (joint members), and the cores 61 function as spacers. Thus, the separation distance between the first substrate 11 and the second substrate 12 is set in accordance with the height of the cores 61. The height of each core 61 is set to, for example, a value that is greater than the total thickness of the adhesion layer 45 and the chip capacitor 40. The height of each core 61 may be, for example, approximately 100 to 500 μm. The diameter of each core 61 may be, for example, approximately 50 to 150 μm. The thickness of each bulge 63, that is, an amount in which the bulge 63 spreads in the planar direction, may be, for example, approximately 10 to 20 μm.

Each connection member 70 is joined to one of the connection pads P2 of the first substrate 11 and one of the connection pads P6 of the second substrate 12. In other words, the connection member 70 is located between the first substrate 11 and the second substrate 12 and includes one end joined to the connection pad P2 and another end joined to the connection pad P6.

Each connection member 70 includes a rod-shaped core 71 and a solder layer 72, which is coated around the core 71. The core 71 is a rod-shaped core and has the form of, for example, a round rod or a polygonal rod. The solder layer 72 coats the entire outer surface of the core 71. The solder layer 72 includes a lower end that forms a bulge 73 spreading in the planar direction at a location proximate to the first substrate 11. For example, the bulge 73 includes a curved outer surface that is bulged away from the core 71 so as to be spherical in a side view. The bulge 73 is bulged upward on the upper surface of the solder resist layer 31. The curved outer surface of the bulge 73 is located proximate to the core 71 at positions near the upper surface of the solder resist layer 31 (lower end of core 71) and an intermediate portion of the core 71. Thus, the solder layer 72 includes a straight rod portion, which coats the upper half of the core 71, and the spherical bulge 73, which is continuous with the straight rod portion and coats the lower half of the core 71. The material of the core 71 may be, for example, a metal such as copper, aluminium, or gold, or an alloy containing at least one of the metals. The material of the solder layer 72 may be, for example, Sn, an alloy of Sn and Cu, an alloy of Sn and Ag, or an alloy of Sn, Ag, and Cu.

The solder layer 72 coats an upper end surface of the core 71 and is joined to the corresponding connection pad P6. For example, the solder layer 72 coats the upper end surface of the core 71 to fill the corresponding opening 56Y of the solder resist layer 56. The solder layer 72 also coats a lower end surface of the core 71 and is joined to the corresponding connection pad P2. For example, the solder layer 72 coats the lower end surface of the core 71 to fill the corresponding opening 31Y of the solder resist layer 31. Thus, the connection member 70 electrically connects the connection pads P2, P6. In the connection members 70 of the present example, the solder layers 72 function as connection terminals (joint members), and the cores 71 function as spacers. The height of each core 71 is set to, for example, a value that is greater than the total thickness of the adhesion layer 45 and the chip capacitor 40. For example, the height of the cores 71 is set to be the same as the height of the cores 61. For example, the height of each core 71 may be, for example, approximately 100 to 500 μm.

As illustrated in FIG. 1A, a gap between the first substrate 11 and the second substrate 12 is filled with the encapsulation resin 80. The encapsulation resin 80 fixes the second substrate 12 to the first substrate 11 and also encapsulates the electronic component 40, which is mounted on the first substrate 11. That is, the encapsulation resin 80 functions as an adhesive agent, which bonds the first substrate 11 and the second substrate 12, and a protection layer, which protects the electronic component 40. Further, the encapsulation resin 80 entirely increases the mechanical strength of the wiring substrate 10.

For example, an insulation resin such as an epoxy resin or a polyimide resin may be used as the material of the encapsulation resin 80. An example of the material of the encapsulation resin 80 is a resin material in which a filler such as silica ($SiO_2$) is mixed in an epoxy resin or a polyimide resin. Other than silica, a filler may be, for example, an inorganic compound such as titanium dioxide, aluminium oxide, aluminium nitride, silicon carbide, calcium titanate, or zeolite, or an organic compound. Additionally, the encapsulation resin 80 may be, for example, a mold resin formed by transfer molding, compression molding, injection molding, or the like.

A method for manufacturing the wiring substrate 10 will now be described. The description will focus on a single wiring substrate 10. However, during actual manufacturing, a batch of wiring substrates 10 is first formed in a large substrate. Then, the large substrate is singulated into a plurality of wiring substrates 10. For the sake of brevity, portions that ultimately become elements of the wiring substrate 10 are indicated by reference characters used to denote the final element.

In the process illustrated in FIG. 2A, the first substrate 11 is prepared. The first substrate 11 may be manufactured through a known manufacturing method, which will now be briefly described with reference to FIG. 2A.

First, through holes 21X are formed to extend through predetermined portions of the core substrate 21. The inner wall defining each through hole 21X is plated to form a through electrode 22. The wiring patterns 25, 26 are formed through a subtractive process or the like. The insulation layers 23, 24 are respectively formed on the upper and lower surfaces of the core substrate 21. For example, a resin film is formed on each of the upper and lower surfaces of the core substrate 21 through a vacuum lamination process. The resin films are heated to be cured. Alternatively, a resin, which is in the form of paste or liquid, may be applied and heated to form the insulation layers 23, 24. Then, openings are formed in the insulation layer 23. After a desmear process is performed as necessary, the via wirings 27 and the wiring patterns 30 are formed through a semi-additive process or the like. In the same manner, openings are formed in the insulation layer 24. After the desmear process is performed as necessary, the via wirings 28 and the wiring patterns 32 are formed through the semi-additive process or the like. The solder resist layer 31 is formed on the upper surface of the insulation layer 23. The solder resist layer 31 is provided with the openings 31X, which expose portions of the wiring patterns 30 as the component connection pads P1, and the openings 31Y, which expose other portions of the wiring patterns 30 as the connection pads P2. In the same manner, the solder resist layer 33 is formed on the lower surface of the insulation layer 24. The solder resist layer 33 is provided with the openings 33X, which expose portions of the wiring patterns 32 as the external connection pads P3. Through the manufacturing process, the first substrate 11 may be manufactured.

Subsequently, the chip capacitor 40 is bonded to the upper surface of the solder resist layer 31 with the adhesion layer 45.

In the process illustrated in FIG. 2B, the connection members 60 are mounted on (joined to) the component connection pads P1, and the connection members 70 are mounted on (joined to) the connection pads P2. An example of a method for mounting the connection members 60, 70 will now be described in detail.

In the process illustrated in FIG. 3A, the connection members 60, 70 are prepared. Each connection member 60 includes a rod-shaped core 61, which is formed from a metal such as copper, and a solder layer 62, which coats the entire outer surface of the core 61. In the same manner, each connection member 70 includes a rod-shaped core 71, which is formed from a metal such as copper, and a solder layer 72, which coats the entire outer surface of the core 71. At this time, the solder layer 62 coats the entire outer surface of the core 61 with a uniform thickness. The solder layer 72 coats the entire outer surface of the core 71 with a uniform thickness.

The connection members 60, 70 are transferred into openings 90X of a transfer jig 90. The openings 90X are located in conformance with positions of the component connection pads P1 and the connection pads P2 of the first substrate 11. The transfer jig 90 is connected to, for example, a vacuum drawing mechanism (not illustrated). When the vacuum drawing mechanism is activated to perform vacuum drawing, the drawing of air from the openings 90X of the transfer jig 90 starts as indicated by the arrows in FIG. 3A. Thus, the connection members 60, 70 are vacuum-drawn and held on bottom walls defining the openings 90X.

In the process illustrated in FIG. 3B, a flux 91 is applied to the component connection pads P1 and the connection pads P2.

In the process illustrated in FIG. 4A, after the transfer jig 90, in which the connection members 60, 70 are inserted, is positioned relative to the first substrate 11, the transfer jig 90 is inverted so that the transfer jig 90 illustrated in FIG. 3B is located upside down. Consequently, the transfer jig 90 is located in a position in which the openings 90X of the transfer jig 90 overlap the component connection pads P1 and the connection pads P2 in a plan view. Then, the vacuum drawing mechanism is deactivated to stop the drawing of air from the openings 90X. As a result, the connection members 60, 70 respectively fall on the flux 91 of the component connection pads P1 and the flux 91 of the connection pads P2. Thus, the connection members 60, 70 are mounted on (temporarily coupled to) the flux 91, which is applied in the openings 31X, 31Y of the solder resist layer 31. In the process illustrated in FIG. 4A, each of the connection members 60, 70 is entirely rod-shaped. The bulges 63, 73, illustrated in FIG. 1B, are not yet formed. Thus, the connection members 60 are not physically or electrically connected to the electrode terminals 42.

In the process illustrated in FIG. 4B, the solder layers 62, 72 of the connection members 60, 70, which are mounted on the first substrate 11, are molten through reflow soldering. Consequently, each solder layer 62 is spread through the flux 91 (refer to FIG. 4A) to fill the opening 31X and joined to the component connection pad P1. When the solder layer 62 is molten, the solder layer 62, which coats the side surface of the core 61, sinks toward the solder resist layer 31 due to its weight. Thus, the solder layer 62 is bulged upward on the upper surface of the solder resist layer 31 and extends in the planar direction (in FIG. 4B, lateral direction). Consequently, the lower end of the solder layer 62 is formed as the bulge 63. The bulge 63 coats the electrode terminal 42 of the chip capacitor 40. In other words, the thickness of the solder layer 62 prior to the reflow soldering is set so that the electrode terminal 42 may be coated by the bulge 63. When the bulge 63 is formed, the bulge 63 (solder layer 62) is joined to the electrode terminal 42. Thus, the solder joins the component connection pad P1 and the electrode terminal 42. Additionally, when the solder layer 62 is molten, the solder layer 62 is bulged upward on the upper end surface of the core 61 due to the surface tension. Consequently, the upper end of the solder layer 62, which coats the upper end surface of the core 61, is formed as a projection 64, which is semi-elliptical in a cross-sectional view.

In the same manner, when the solder layers 72 are molten, the solder layers 72 are spread through the flux 91 to fill the openings 31Y and joined to the connection pads P2. Also, each solder layer 72, which coats the side surface of the core 71, sinks toward the solder resist layer 31 due to its weight. Thus, the solder layer 72 is bulged upward on the upper surface of the solder resist layer 31 and extends in the planar direction. Consequently, the lower end of the solder layer 72 is formed as the bulge 73. Additionally, when the solder layer 72 is molten, the upper end of the solder layer 72, which coats the upper end surface of the core 71, is formed as a projection 74, which is semi-elliptical in a cross-sectional view.

Through the above process, the connection members 60, 70 are mounted on the first substrate 11. Subsequently, the flux 91 is removed through a surface cleaning process.

In the process illustrated in FIG. 5A, the second substrate 12 is prepared. The second substrate 12 may be manufactured through a known manufacturing method, which will now be briefly described with reference to FIG. 5A. FIG. 5A illustrates the structural body of FIG. 1A that is inverted.

First, through holes 51X are formed to extend through predetermined portions of the core substrate 51. The inner wall defining each through hole 51X is plated to form a through electrode 52. The wiring patterns 53, 55 are formed through a subtractive process or the like. The solder resist layers 54, 56 are formed. The solder resist layer 54 is provided with the openings 54X, which expose portions of the wiring patterns 53 as the component connection pads P4. The solder resist layer 56 is provided with the openings 56X, which expose portions of the wiring patterns 55 as the component connection pads P5, and the openings 56Y, which expose other portions of the wiring patterns 55 as the connection pads P6. Through the manufacturing process, the second substrate 12 may be manufactured.

Subsequently, a flux 92 is applied to the component connection pads P5 and the connection pads P6 of the second substrate 12.

The first substrate 11, on which the chip capacitor 40 and the connection members 60, 70 are mounted, is placed above the second substrate 12, that is, above the solder resist layer 56. At this time, the first substrate 11 is positioned so that the connection members 60 (component connection pads P1) are faced toward the component connection pads P5 and the connection members 70 (connection pads P2) are faced toward the connection pads P6.

In the process illustrated in FIG. 5B, the connection members 60 are joined to the component connection pads P5, and the connection members 70 are joined to the connection pads P6. As a result, the connection members 60, 70 are held between the first substrate 11 and the second substrate 12. More specifically, the connection members 60, 70 of the first substrate 11 are temporarily coupled to the second substrate 12 with the adhesive flux 92. Then, the first substrate 11 and the second substrate 12 are thermally compressed and bonded at a temperature of, for example, approximately 230° C. to 260° C. This melts the solder layers 62, 72 of the connection members 60, 70 and joins the connection members 60 to the component connection pads P5 and the connection members 70 to the connection pads P6. More specifically, each solder layer 62 (particularly, projection 64 illustrated in FIG. 4B) spreads through the flux 92 (refer to FIG. 5A) to fill the opening 56X and is joined to the component connection pad P5. In the same manner, each solder layer 72 (particularly, projection 74 illustrated in FIG. 4B) spreads through the flux 92 (refer to FIG. 5A) to fill the opening 56Y and is joined to the connection pad P6. Through the joining process, the component connection pads P1, P5 are electrically connected to the electrode terminals 42 via the connection members 60. Also, the connection pads P2, P6 are electrically connected via the connection members 70. Further, the first substrate 11 is fixed to the second substrate 12 via the connection members 60, 70. In the present process, the solder layers 62, 72 include the projections 64, 74 (refer to FIG. 4B). This allows the joining of the component connection pads P5 to the connection members 60 and the connection pads P6 to the connection members 70 without forming solder on the component connection pads P5 and the connection pads P6 of the second substrate 12 in advance. Subsequently, the flux 92 is removed through a surface cleaning process.

In the process illustrated in FIG. 6A, a gap between the first substrate 11 and the second substrate 12, that is, a gap between the solder resist layer 31 and the solder resist layer 56, is filled with the encapsulation resin 80. The encapsulation resin 80 firmly fixes the first substrate 11 and the second substrate 12. Additionally, the encapsulation resin 80 encapsulates the chip capacitor 40. For example, when a thermosetting mold resin is used as the material of the encapsulation resin 80, the structural body illustrated in FIG. 5B is placed in a mold, and pressure (e.g., 5 to 10 MPa) is applied to the mold. After a fluid mold resin is guided into the mold, the mold resin is heated and cured at a temperature of approximately 180° C. to form the encapsulation resin 80. Examples of a process for filling the mold resin include transfer molding, compressing molding, and injection molding. FIG. 6A illustrates the structural body of FIG. 5B that is inverted.

In the process illustrated in FIG. 6B, the external connection terminals 35 are formed on the external connection pads P3. For example, after a flux is applied to the external connection pads P3, the external connection terminals 35 (here, solder balls) are mounted on the external connection pads P3. The external connection terminals 35 undergo reflow at a temperature of approximately 240° C. to 260C° to be fixed to the external connection pads P3. Subsequently, the flux is removed through a surface cleaning process. Through the above manufacturing process, the wiring substrate 10 may be manufactured.

The present embodiment has the advantages described below.

(1) The connection members 60, which are formed on the component connection pads P1, each include a solder layer 62 and a bulge 63, which is formed on the lower end of the solder layer 62. The bulge 63 is spread from the core 61 in the planar direction and joined to the corresponding electrode terminal 42 of the electronic component 40. In other words, a portion of the solder layer 62 extends in the planar direction to form the bulge 63. The solder layers 62 (bulges 63) electrically connect the component connection pads P1 and the electrode terminals 42. This shortens connection wirings that electrically connect the component connection pads P1 and the electrode terminals 42, which are located proximate to each other, compared to when coupling by wire bonding. Thus, the transmission speed of signals (data) is increased between the component connection pads P1 and the electrode terminals 42.

(2) The component connection pads P1 and the electrode terminals 42 do not have to be connected by bonding wires. This eliminates the need to form a wire loop between the first substrate 11 and the second substrate 12. Thus, the wiring substrate 10 is entirely thinned compared to when the electronic component 40 is coupled to the first substrate 11 by wire bonding.

(3) The component connection pads P1 and the electrode terminals 42 are electrically connected by the solder layers 62, which extend in the planar direction. This reduces the impedance of wirings that connect the component connection pads P1 and the electrode terminals 42 compared to when fine wirings such as bonding wires are used. Thus, the transmission speed of signals (data) is increased between the component connection pads P1 and the electrode terminals 42.

(4) The cores 61 are rod-shaped. The cores 61 maintain the desired separation distance between the first substrate 11 and the second substrate 12 and also ensure a sufficient solder amount in the solder layers 62. Also, when the height of the cores 61 is adjusted, the separation distance between the first substrate 11 and the second substrate 12 is adjusted to a desired distance.

Additionally, prior to reflow soldering, the solder layers 62 are formed to coat the entire outer surfaces of the rod-shaped cores 61. This ensures a sufficient solder amount in the solder layers 62.

Further, since each core 61 is rod-shaped, when the solder layer 62 is molten, the solder layer 62 that coats the side surface of the core 61 has the tendency to sink due to its weight. This appropriately forms the bulge 63 in the lower end of the solder layer 62.

(5) When the component connection pads P5, which are formed on the lowermost wiring layer of the second substrate 12, are located to face the component connection pads P1, the component connection pads P5 are joined to the connection members 60. Thus, the connection members 60 electrically connect the component connection pads P1, the component connection pads P5, and the electrode terminals 42. This allows the component connection pads P1, P5 and the electrode terminals 42 to be electrically connected to one another without extending wirings from the component connection pads P1 in the planar direction. Thus, the connection wirings that electrically connect the electrode terminals 42 and the component connection pads P1, P5 are drastically shortened compared to the prior art.

It should be apparent to those skilled in the art that the above embodiment may be embodied in many other specific forms without departing from the scope of the invention. Particularly, it should be understood that the above embodiment may be embodied in the following forms.

In the above embodiment, the chip capacitor 40, functioning as an electronic component, is mounted on the first substrate 11. However, instead of the chip capacitor 40, a different electronic component (e.g., chip component other than chip capacitor, semiconductor chip, or the like) may be mounted on the first substrate 11.

Figure 7:
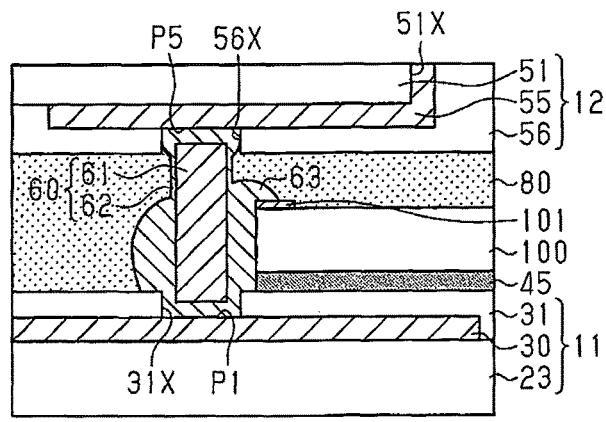
FIGS. 7 to 9 are schematic cross-sectional views illustrating portions of various modified examples of a wiring substrate.

For example, as illustrated in FIG. 7, a semiconductor chip 100, functioning as an electronic component, may be mounted on the first substrate 11. The semiconductor chip 100 includes, for example, a thin semiconductor substrate, which is formed from silicon (Si) or the like, and an electrode terminal 101 (connection terminal), which is located on a circuit formation surface (here, upper surface) of the semiconductor substrate. In the semiconductor chip 100, a semiconductor integrated circuit (not illustrated) is formed on the circuit formation surface of the semiconductor substrate. The electrode terminal 101 may be formed, for example, by stacking an under bump metal (UBM) layer on aluminium. Examples of a UBM layer include a metal layer in which titanium (Ti) and copper are sequentially stacked, a metal layer in which nickel (Ni) and gold are sequentially stacked, and the like. In the example of FIG. 7, when the semiconductor chip 100 is located so that a surface (here, lower surface) opposite to the circuit formation surface is faced toward the solder resist layer 31 (first substrate 11), that is, in a face-up position, the semiconductor chip 100 is bonded to the upper surface of the solder resist layer 31 (first substrate 11) with the adhesion layer 45.

The electrode terminal 101 of the semiconductor chip 100, which is located proximate to the component connection pads P1, P5 in a plan view, is electrically connected to the component connection pads P1, P5 via the connection member 60. In the same manner as the above embodiment, the bulge 63 of the solder layer 62 is bulged upward on the upper surface of the solder resist layer 31. Also, at a location proximate to the lower end of the connection member 60, the bulge 63 spreads from the core 61 in the planar direction. The bulge 63 is joined to the electrode terminal 101. For example, the bulge 63 is formed to be bulged upward on the upper surface of the electrode terminal 101.

The structure illustrated in FIG. 7 has the same advantages as the above embodiment. Since solder has relatively low wettability relative to a silicon semiconductor substrate, solder does not spread on the semiconductor substrate. Thus, the bulge 63 of the solder layer 62 is not adhered to the semiconductor substrate of the semiconductor chip 100. Thus, the interface between the bulge 63 and the semiconductor substrate is a pressed interface.

Figure 8:
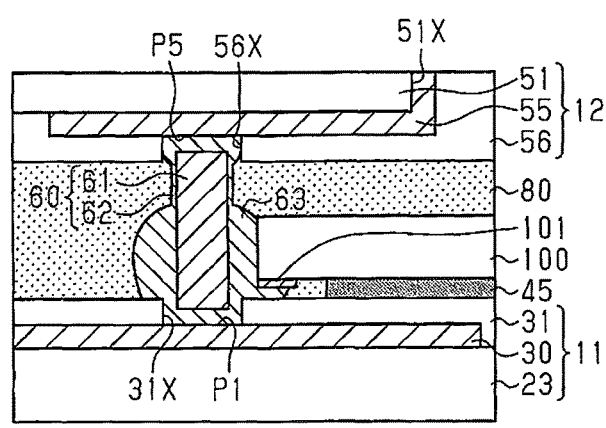

Additionally, for example, as illustrated in FIG. 8, when the semiconductor chip 100 is located so that the circuit formation surface (here, lower surface) of the semiconductor substrate is faced toward the solder resist layer 31 (first substrate 11), that is, in a face-down position, the semiconductor chip 100 may be bonded to the upper surface of the solder resist layer 31 (first substrate 11) with the adhesion layer 45. Also, in this structure, the electrode terminal 101 of the semiconductor chip 100 is located proximate to the component connection pads P1, P5 in a plan view and electrically connected to the component connection pads P1, P5 via the connection member 60. Additionally, in the same manner as the above embodiment, the bulge 63 of the solder layer 62 is bulged upward on the upper surface of the solder resist layer 31 and spreads from the core 61 in the planar direction at a location proximate to the lower end of the connection member 60. The bulge 63 is joined to the electrode terminal 101. For example, the bulge 63 is formed to enter a gap between the electrode terminal 101 and the solder resist layer 31.

In this manner, the solder layer 62 (bulge 63), which extends in the planar direction from the core 61 located on the component connection pad P1, is joined to the electrode terminal 101. Thus, the solder joins the electrode terminal 101 and the component connection pad P1. This eliminates the need to form a connection terminal such as a bump on the electrode terminal 101 before coupling the semiconductor chip 100 to the first substrate 11.

Additionally, since the semiconductor chip 100, in a face-down position (refer to FIG. 8), can be coupled to the first substrate 11, for example, another semiconductor chip having the same size as the semiconductor chip 100 may be mounted on the semiconductor chip 100. Moreover, when a number of semiconductor chips are stacked, the connection member 60 may be used to electrically connect an electrode terminal of the uppermost semiconductor chip and an electrode terminal of the lowermost semiconductor chip. For example, when the bulge 63 of the solder layer 62 is joined to an electrode terminal formed on the upper surface of the uppermost semiconductor chip and an electrode terminal formed on the lower surface of the lowermost semiconductor chip, the two electrode terminals are electrically connected to each other.

Also, in the modified example of FIG. 8, the interface between the bulge 63 and the semiconductor substrate of the semiconductor chip 100 is a pressed interface.

Figure 9:
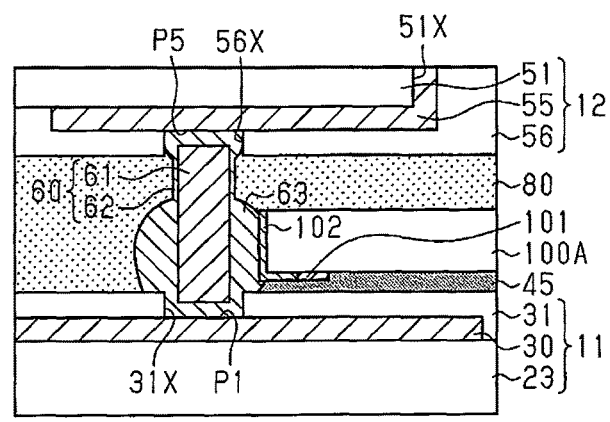

In the semiconductor chip 100 illustrated in FIGS. 7 and 8, the electrode terminal 101 is formed in a peripheral region of the circuit formation surface of the semiconductor substrate. Instead, for example, as illustrated in FIG. 9, the electrode terminal 101 may be formed in a region located inward from the peripheral region of the circuit formation surface (here, lower surface) of a semiconductor chip 100A. In this case, for example, a connection wiring 102 coating a side surface of the semiconductor chip 100A is formed to be electrically connected to the electrode terminal 101. The connection wiring 102 is located proximate to the component connection pads P1, P5 in a plan view. The connection wiring 102 is electrically connected to the component connection pads P1, P5 via the connection member 60. This electrically connects the electrode terminal 101 to the component connection pads P1, P5 via the connection member 60 and the connection wiring 102. Even when the electrode terminal 101 is formed in an inward region of the circuit formation surface, the electrode terminal 101 and the component connection pads P1, P5 are electrically connected via the connection wiring 102 and the connection member 60. For example, silver or an alloy of silver may be used as the material of the connection wiring 102.

In the modified example illustrated in FIG. 9, the connection wiring 102 coats the entire side surface (i.e., from lower end to upper end of side surface) of the semiconductor chip 100A. However, the connection wiring 102 only needs to extend from the electrode terminal 101 to the peripheral region of the circuit formation surface of the semiconductor substrate. Thus, for example, the connection wiring 102 may be formed to coat the semiconductor chip 100A from the lower end of the side surface to an intermediate portion of the side surface in the thickness-wise direction.

In the modified example illustrated in FIG. 9, the semiconductor chip 100A, in a face-down position, is mounted on the upper surface of the solder resist layer 31. Instead, the semiconductor chip 100A may be located in a face-up position when mounted on the upper surface of the solder resist layer 31. Also, in this case, the connection wiring 102 only needs to extend from the electrode terminal 101 to the peripheral region of the circuit formation surface of the semiconductor substrate.

In the wiring substrate 10 of each of the above embodiment and modified examples, a plurality of electronic components may be mounted on the first substrate 11.

In the above embodiment and modified examples, in addition to the connection members 60, the component connection pads P1, P5 and the electrode terminals 42, 101 of the electronic components (chip capacitor 40 or semiconductor chips 100, 100A) may be connected by a means other than the connection members 60. Also, the connection pads P2, P6 may be connected by the connection members 70 and by a means other than the connection members 70.

For example, a plurality of electrode terminals including the electrode terminals 101 are located in the semiconductor chips 100, 100A of the modified examples illustrated in FIGS. 7 to 9. In this case, the connection members 60 do not necessarily have to be applied to all of the electrode terminals. For example, some of the electrode terminals are respectively joined to the component connection pads P1 by the connection members 60. The other of the electrode terminals may be respectively joined to the component connection pads P1 by a different joining means.

Figure 10:
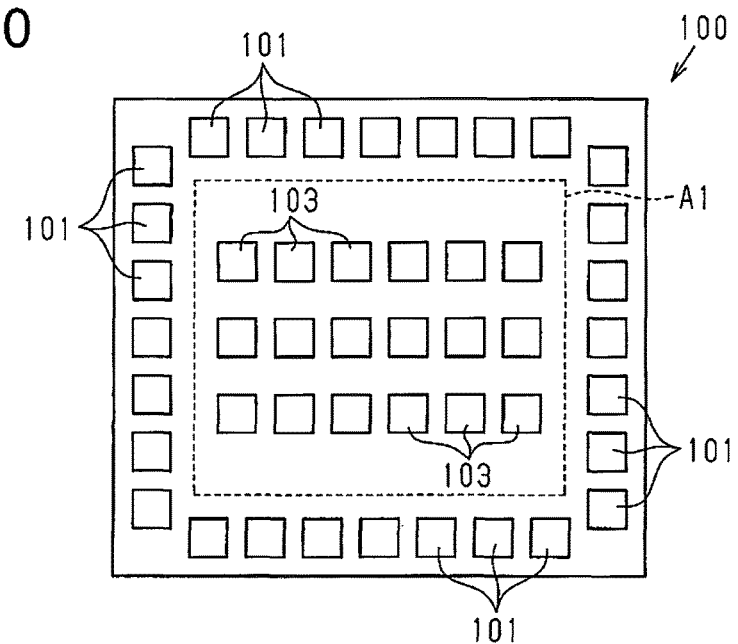
FIG. 10 is a schematic plan view illustrating a semiconductor chip of a modified example.

For example, the semiconductor chip 100 illustrated in FIG. 10 includes the electrode terminals 101, which are laid out in the peripheral region (e.g., region outside the broken line of FIG. 10) in a peripheral arrangement, and electrode terminals 103, which are laid out in a region µl inside the peripheral region in a matrix arrangement. In this case, when the electrode terminals 101 are respectively joined to the component connection pads P1 (not illustrated) by the connection members 60, the electrode terminals 103 may be respectively flip-chip-joined to the component connection pads P1 (not illustrated). The adhesion layer 45 may be omitted from this structure. However, in this case, before the semiconductor chip 100 is coupled to the first substrate 11, bumps need to be formed on the electrode terminals 103.

Additionally, the connection member connecting the connection pads P2 and the connection pads P6 is not limited to the connection member 70. For example, solder balls or rod-shaped metal posts may be used. Examples of a solder ball include a core solder ball having a structure in which a spherical core ball is coated by solder, a coreless solder ball excluding a core ball, and the like. Examples of a core ball include a conductive core ball formed from a metal such as copper, gold, nickel, or the like and a resin core ball formed from a resin.

In the above embodiment and modified examples, the component connection pads P1, P5 are electrically connected to the electrode terminals 42, 101 by the connection members 60. Instead, for example, the connection members 60 may electrically connect only the component connection pads P1 to the electrode terminals 42, 101. In this case, the wiring patterns 30 including the component connection pads P1 are electrically connected to the component connection pads P5 by connection members other than the connection members 60.

In the above embodiment and modified examples, the connection members 60 electrically connect the component connection pads P1, which are formed in the first substrate 11, and the electrode terminals 42, 101 of the electronic components (chip capacitor 40 or semiconductor chips 100, 100A). Instead, for example, two connection pads formed in the first substrate 11 may be electrically connected to each other via the connection member 60. In this case, the electronic component may be omitted from the first substrate 11.

Figure 11:
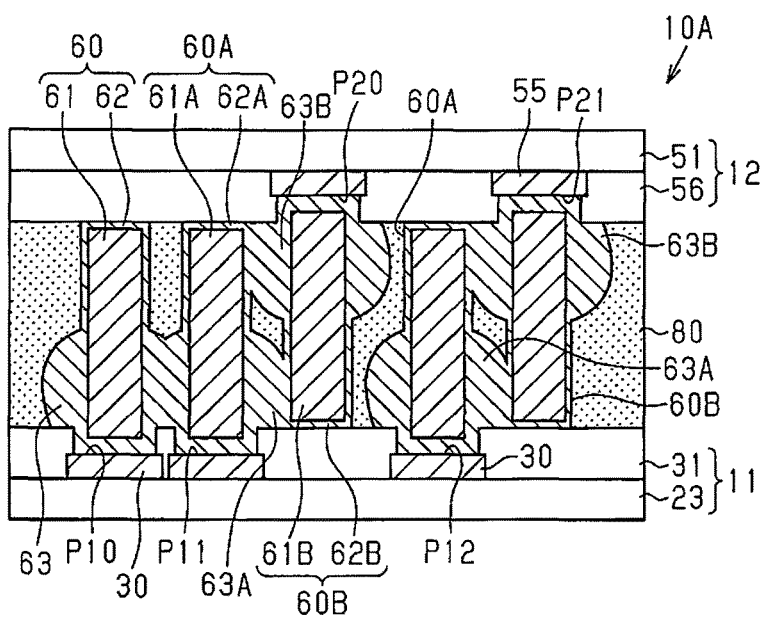
FIG. 11 is a schematic cross-sectional view illustrating a portion of another modified example of a wiring substrate.

FIG. 11 illustrates a wiring substrate 10A of a modified example. In the wiring substrate 10A, connection pads P10, P11 are located proximate to each other on the insulation layer 23 of the first substrate 11. The connection pads P10, P11 may be electrically connected to each other via the connection member 60. More specifically, the connection member 60 is formed on the connection pad P10, and a connection member 60A is formed on the connection pad P11. The connection member 60A has the same structure as the connection member 60. More specifically, the connection member 60A includes a rod-shaped core 61A and a solder layer 62A, which is coated around the core 61A. In the same manner as the solder layer 62, the solder layer 62A includes a lower end that forms a bulge 63A spreading from the core 61A in the planar direction at a location proximate to the solder resist layer 31. The bulge 63 of the connection member 60 is joined to the bulge 63A of the connection member 60A. In other words, the bulge 63 (solder layer 62) of the connection member 60 and the bulge 63A (solder layer 62A) of the connection member 60A are combined to form a single solder layer on the connection pads P10, P11. Thus, the connection pads P10, P11 are electrically connected to each other via the connection members 60, 60A.

In this manner, when the solder layers 62, 62A of the connection members 60, 60A, which are formed on the connection pads P10, P11, are extended in the planar direction and combined together, the connection pads P10, P11 are electrically connected to each other. Thus, when there are not enough wiring patterns 30, which are formed on the upper surface of the first substrate 11, for the wiring connection, the connection members 60, 60A may be used to provide a three-dimensional wiring connection. The upper end surfaces of the connection members 60, 60A are in contact with the lower surface of the solder resist layer 56 of the second substrate 12.

Additionally, in the wiring substrate 10A illustrated in FIG. 11, the connection pads P10, P11 are electrically connected to a connection pad P20, which is formed in the second substrate 12, via the connection member 60A. The connection pad P20 is formed on the lower surface of the core substrate 51. The connection pad P20 is located proximate to the connection pad P11 in a plan view. A connection member 60B is formed on the connection pad P20. The connection member 60B has the same structure as the connection members 60, 60A. More specifically, the connection member 60B includes a rod-shaped core 61B and a solder layer 62B, which is coated around the core 61B. The solder layer 62B includes an upper end that forms a bulge 63B spreading from the core 61B in the planar direction at a location proximate to the solder resist layer 56. The bulge 63B of the connection member 60B is joined to the upper end of the connection member 60A. Additionally, the bulge 63A of the connection member 60A is joined to the lower end of the connection member 60B. In other words, the bulge 63B (solder layer 62B) of the connection member 60B and the solder layer 62A (bulge 63A) of the connection member 60A are combined to form a single solder layer between the connection pads P11, P20. Thus, the connection members 60, 60A, 60B electrically connect the connection pads P10, P11, formed in the first substrate 11, and the connection pad P20, formed in the second substrate 12. The lower end surface of the connection member 60B is in contact with the upper surface of the solder resist layer 31 of the first substrate 11.

Also, in the wiring substrate 10A, further connection members 60A, 60B electrically connect a connection pad P12, which is formed in the first substrate 11, and a connection pad P21, which is formed in the second substrate 12.

A method for manufacturing the wiring substrate 10A will now be described.

Figure 12A:
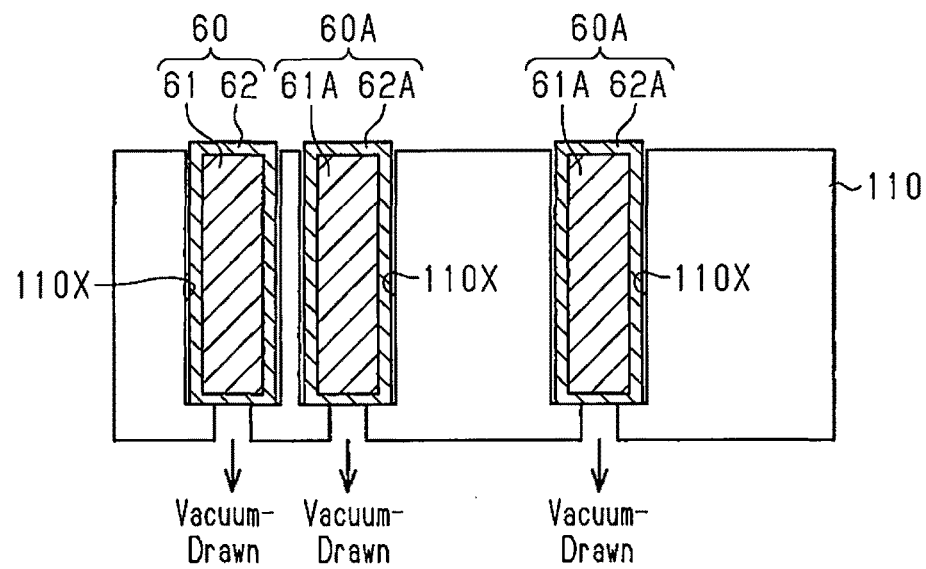
FIGS. 12A, 12B, 13A, and 13B are schematic cross-sectional views illustrating a method for manufacturing the wiring substrate of FIG. 11.

In the process illustrated in FIG. 12A, the connection members 60, 60A are prepared. The connection member 60 includes the rod-shaped core 61, which is formed from a metal such as copper, and the solder layer 62, which coats the entire outer surface of the core 61. Also, each connection member 60A includes the rod-shaped core 61A, which is formed from a metal such as copper, and the solder layer 62A, which coats the entire outer surface of the core 61A. The solder layer 62 coats the entire outer surface of the core 61 at a uniform thickness. The solder layer 62A coats the entire outer surface of the core 61A at a uniform thickness.

The connection members 60, 60A are transferred into openings 110X of a transfer jig 110. The openings 110X are located in positions in conformance with positions of the connection pads P10, P11, P12 (refer to FIG. 11) of the first substrate 11. When a vacuum drawing mechanism (not illustrated) is activated to perform vacuum drawing, the connection members 60, 60A are vacuum-drawn and held on bottom walls defining the openings 110X.

Figure 12B:
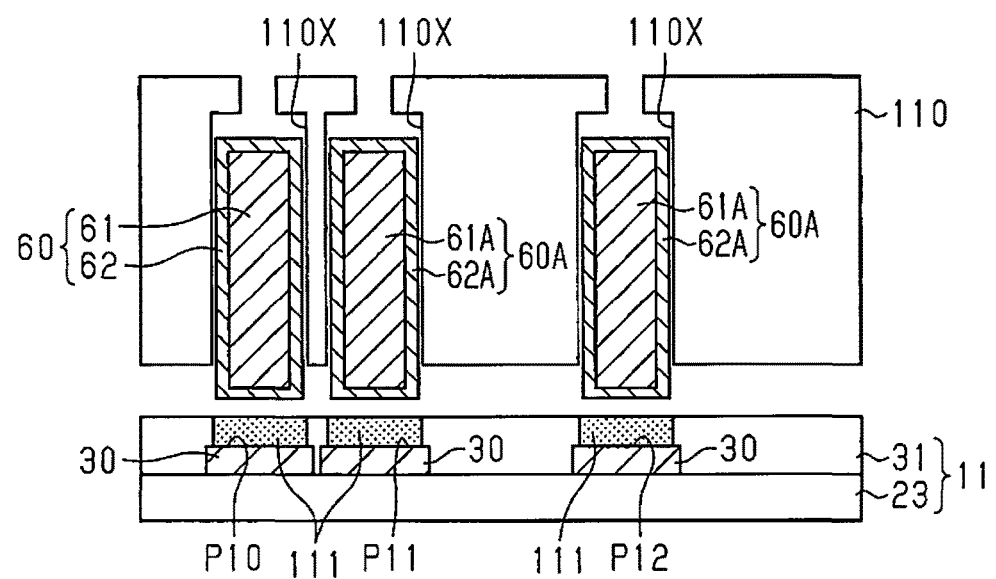

In the process illustrated in FIG. 12B, a flux 111 is applied to the connection pads P10, P11, P12. The transfer jig 110 is inverted so that the transfer jig 110 illustrated in FIG. 12A is located upside down. Then, the vacuum drawing mechanism (not illustrated) is deactivated to stop the vacuum drawing. Consequently, the connection members 60, 60A respectively fall on the flux 111 of the connection pads P10, P11, P12. In the process illustrated in FIG. 12B, each of the connection members 60, 60A is entirely rod-shaped. The bulges 63, 63A, illustrated in FIG. 11, are not yet formed. Thus, the connection members 60, 60A are not physically or electrically connected.

Figure 13A:
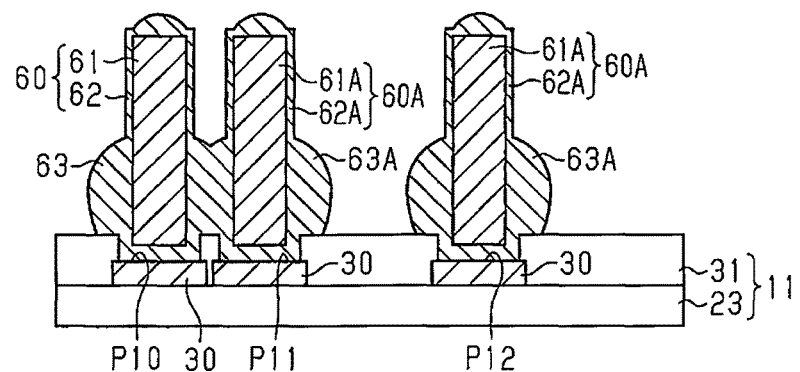

In the process illustrated in FIG. 13A, the solder layers 62, 62A of the connection members 60, 60A are molten through reflow soldering. When the solder layers 62, 62A are molten, the solder layers 62, 62A extend in the planar direction at the lower ends of the connection members 60, 60A. Thus, the lower ends of the solder layers 62, 62A are formed as the bulges 63, 63A, respectively. Additionally, the bulges 63, 63A are combined on the connection pads P10, P11, which are located proximate to each other. As a result, as illustrated in FIG. 13A, a single solder layer is formed on the connection pads P10, P11. Thus, the connection pad P10 is electrically connected to the connection pad P11 via the connection members 60, 60A. Through the manufacturing process, the integrated connection members 60, 60A are joined to the connection pads P10, P11 of the first substrate 11, and another connection member 60A is joined to the connection pad P12.

Figure 13B:
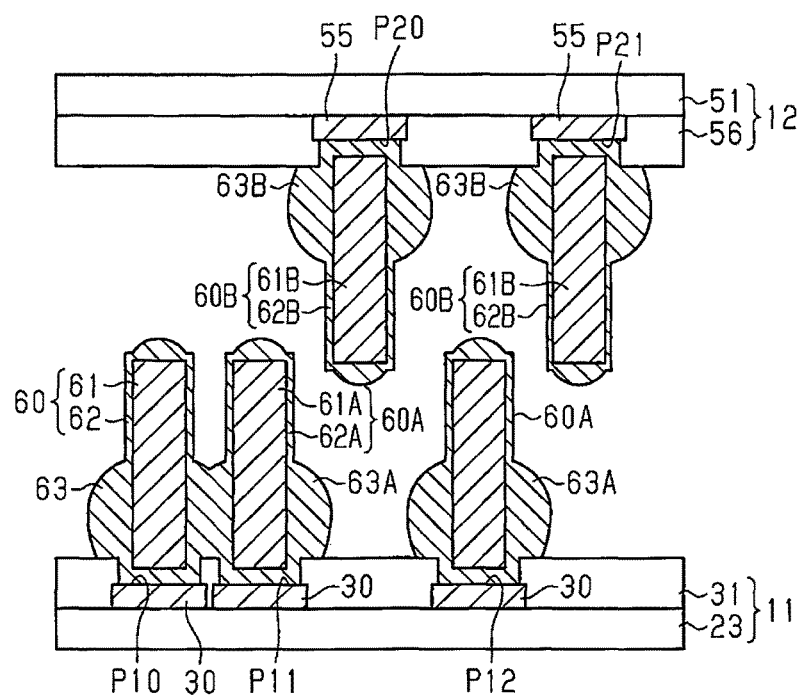

In the same manner as the process illustrated in FIGS. 12A to 13A, in the process illustrated in FIG. 13B, the connection members 60B are respectively connected to the connection pads P20, P21 of the second substrate 12. Here, the upper end of each connection member 60B includes the bulge 63B, which spreads from the core 61B in the planar direction. Then, the second substrate 12 is placed above the first substrate 11. More specifically, the second substrate 12 is positioned so that the connection members 60A (connection pads P11, P12) are located proximate to the connection members 60B (connection pads P20, P21) in a plan view. Then, the second substrate 12 is mounted on the first substrate 11 so that the connection members 60, 60A, 60B are held between the first substrate 11 and the second substrate 12. The first substrate 11 and the second substrate 12 are thermally compressed. This melts the solder layers 62, 62A, 62B of the connection members 60, 60A, 60B and joins the connection members 60A and the connection members 60B.

In the wiring substrate 10A illustrated in FIG. 11, the upper end surface of each of the connection members 60, 60A is in contact with the lower surface of the solder resist layer 56, and the lower end surface of each connection member 60B is in contact with the upper surface of the solder resist layer 31.

Figure 14A:
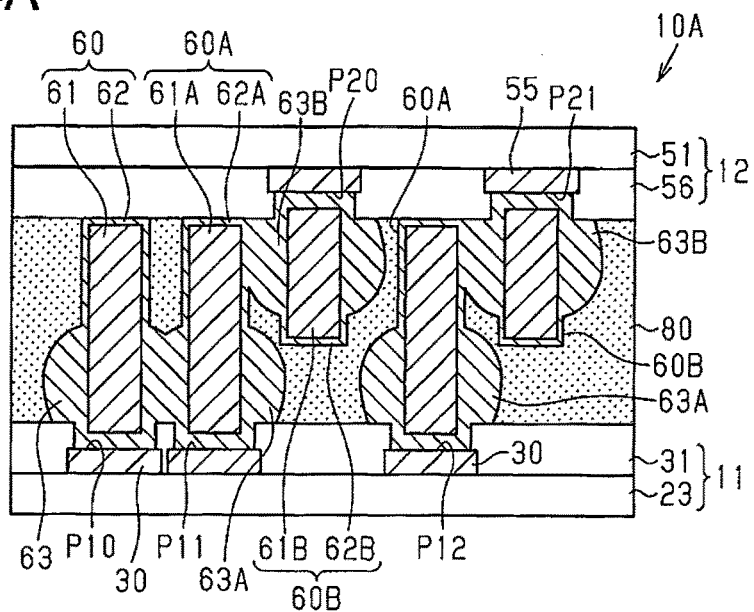
FIGS. 14A and 14B are schematic cross-sectional views illustrating various modified examples of the wiring substrate of FIG. 11.

Instead, for example, as illustrated in FIG. 14A, the cores 61B of the connection members 60B, which are respectively mounted on the connection pads P20, P21 of the second substrate 12, may be shorter than the cores 61, 61A of the connection members 60, 60A. In this case, the lower end surface of each connection member 60B is not in contact with the upper surface of the solder resist layer 31. Thus, in this example, only the cores 61, 61A function as spacers. Even in this case, each connection member 60B is joined to one of the connection members 60A by the bulge 63B.

Figure 14B:
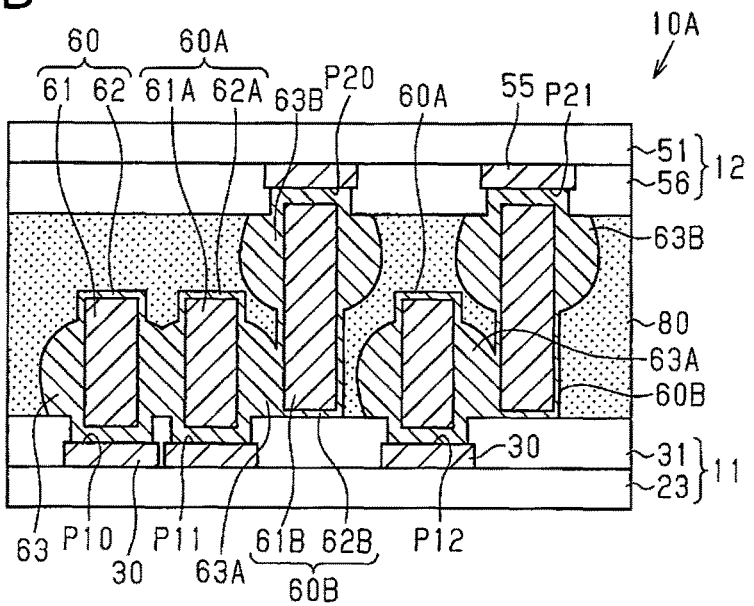

Alternatively, as illustrated in FIG. 14B, the cores 61, 61A of the connection members 60, 60A, which are respectively mounted on the connection pads P10, P11, P12 of the first substrate 11, may be shorter than the cores 61B of the connection members 60B. In this case, the upper end surface of each of the connection members 60, 60A is not in contact with the lower surface of the solder resist layer 56. Thus, in this example, only the cores 61B function as spacers. Even in this case, the connection member 60 is joined to the corresponding connection member 60A by the bulge 63, and each connection member 60A is joined to one of the connection members 60B by the bulge 63A.

In the wiring substrate 10A illustrated in FIGS. 11 and 14B, the connection pad P10, which is joined to the connection member 60, and the connection pad P11, which is joined to the connection member 60A, are electrically connected via the connection members 60, 60A. Instead, when the connection member 60A that is joined to the connection pad P11 is omitted, the bulge 63 of the connection member 60 may be directly joined to the connection pad P11.

In the above embodiment and modified examples, the connection members 60, 60A, 60B, 70 include the cores 61, 61A, 61B, 71 formed from a metal such as copper. Instead, the cores 61, 61A, 61B, 71 may be formed from a resin.

Additionally, the connection members connecting the connection pad P10 and the connection pad P11 are not limited to the connection members 60, 60A. For example, solder balls may be used. Examples of a solder ball include a solder ball having a structure in which a spherical core ball is coated by solder, a solder ball excluding a core ball, and the like. Examples of a core ball include a conductive core ball formed from a metal such as copper, gold, nickel, or the like and a resin core ball formed from a resin.

The encapsulation resin 80 may be omitted from the above embodiment and modified examples.

In the second substrate 12 of the above embodiment and modified examples, the inner layer structure between the wiring patterns 53, formed on the uppermost wiring layer, and the wiring patterns 55, formed on the lowermost wiring layer, is not particularly limited. The second substrate 12 only needs to have a structure in which the wiring patterns 53, 55 are electrically connected to each other via the interior of the substrate. For example, the structure and material of the core substrate 51 is not particularly limited. Further, a desired number of wiring layers and insulation layers, which coat the wiring layers, may be formed on the core substrate 51. Alternatively, the second substrate 12 may be a coreless substrate that does not include the core substrate 51.

The second substrate 12 may be omitted from the above embodiment and modified examples. In this case, in the wiring substrate 10, the electrode terminals 42, 101 of the electronic components (chip capacitor 40 or semiconductor chips 100, 100A) are electrically connected to only the component connection pads P1 via the connection members 60. In the same manner, in the wiring substrate 10A illustrated in FIG. 11, the connection pad P11 is electrically connected to only the connection pad P10 via the connection members 60, 60A.

In the first substrate 11 of the above embodiment and modified examples, the inner layer structure between the wiring patterns 30, formed on the uppermost wiring layer, and the wiring patterns 32, formed on the lowermost wiring layer, is not particularly limited. The first substrate 11 only needs to have a structure in which the wiring patterns 30, 32 are electrically connected to each other via the interior of the substrate. For example, the structure and material of the core substrate 21 is not particularly limited. Further, the number of wiring layers (e.g., wiring patterns 25, 26) formed on the core substrate 21 and insulation layers (e.g., insulation layers 23, 24) coating the wiring layers is not particularly limited. Alternatively, the substrate body 20 may be changed from the build-up core substrate including the core substrate 51 to a coreless substrate that does not include the core substrate 51.

CLAUSES

This disclosure further encompasses the following embodiment.

1. A method for manufacturing a wiring substrate, the method including:

preparing a first substrate, wherein the first substrate includes an uppermost wiring layer, and the uppermost wiring layer includes a first pad;

mounting an electronic component on an upper surface of the first substrate, wherein the electronic component includes an electrode terminal, and the electrode terminal is located proximate to the first pad in a plan view;

preparing a connection member, wherein the connection member includes a rod-shaped core and a solder layer coated around the core;

mounting the connection member on the first pad; and melting the solder layer to form a bulge on a lower end of the solder layer, wherein the bulge is bulged upward on an upper surface of the first substrate and spreads from the core in a planar direction so that the bulge is joined to the electrode terminal.

2. The method according to clause 1, further including:

preparing a second substrate, wherein the second substrate includes a lowermost wiring layer, and the lowermost wiring layer includes a second pad;

after forming the bulge in the lower end of the solder layer, positioning the first substrate so that the connection member is faced toward the second pad of the second substrate; and joining the solder layer to the second pad so that the first substrate is fixed to the second substrate.

3. A method for manufacturing a wiring substrate, the method including:

preparing a first substrate, wherein the first substrate includes an uppermost wiring layer, and the uppermost wiring layer includes a first pad and a second pad, which are located proximate to each other;

preparing a first connection member and a second connection member, wherein the first connection member includes a rod-shaped first core and a first solder layer coated around the first core, and the second connection member includes a rod-shaped second core and a second solder layer coated around the second core;

mounting the first connection member on the first pad;

mounting the second connection member on the second pad; and melting the first solder layer and the second solder layer to form a first bulge on a lower end of the first solder layer and a second bulge on a lower end of the second solder layer, wherein the first bulge spreads from the first core in a planar direction and the second bulge spreads from the second core in the planar direction so that the first bulge and the second bulge are joined to each other.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to an illustration of the superiority and inferiority of the invention. Although embodiments of the present invention have been described in detail, it should be understood that various changes, substitutions, and alterations could be made hereto without departing from the spirit and scope of the invention.

The invention claimed is:

1. A wiring substrate comprising:
 a first substrate including an uppermost wiring layer;
 a first pad formed on the uppermost wiring layer of the first substrate;
 a second substrate mounted above the first substrate and including a lowermost wiring layer;
 a second pad formed on the lowermost wiring layer of the second substrate and located at a position facing the first pad of the first substrate;
 an electronic component mounted on an upper surface of the first substrate and located between the first substrate and the second substrate;
 a connection terminal formed on the electronic component and located proximate to the first pad in a plan view; and
 a connection member joined to the first pad, the second pad, and the connection terminal to electrically connect the first pad, the second pad, and the connection terminal,
 wherein the connection member includes
  a rod-shaped core, and
  a solder layer coated around the core and joined to the first pad and the second pad, and
 the solder layer includes a bulge that spreads from the core of the connection member in a planar direction, the bulge being joined to the connection terminal of the electronic component.

2. The wiring substrate according to claim 1, wherein
 the solder layer includes a straight rod portion which coats an upper half of the core, and
 the bulge of the solder layer is continuous with the straight rod portion and coats a lower half of the core.

3. The wiring substrate according to claim 1, wherein
 the electronic component comprises a chip component that includes a body and two electrode terminals, which cover opposing side surfaces of the body, and
 each of the electrode terminals of the chip component functions as the connection terminal.

4. The wiring substrate according to claim 1, wherein
 the electronic component comprises a semiconductor chip that includes a semiconductor substrate having a circuit formation surface and an electrode terminal arranged on the circuit formation surface of the semiconductor substrate, the semiconductor chip is mounted on the first substrate with a surface opposite to the circuit formation surface faced toward the first substrate, and the electrode terminal of the semiconductor chip functions as the connection terminal.

5. The wiring substrate according to claim 1, wherein the electronic component includes a semiconductor chip that includes a semiconductor substrate having a circuit formation surface and an electrode terminal arranged on the circuit formation surface of the semiconductor substrate, the semiconductor chip is mounted on the first substrate with the circuit formation surface faced toward the first substrate, and the electrode terminal of the semiconductor chip functions as the connection terminal.

6. A wiring substrate comprising:

a first substrate including an uppermost wiring layer;

a first pad formed on the uppermost wiring layer of the first substrate;

an electronic component mounted on an upper surface of the first substrate;

a connection terminal formed on the electronic component and located proximate to the first pad in a plan view; and a connection member formed on the first pad to electrically connect the first pad and the connection terminal, wherein the connection member includes a rod-shaped core, and a solder layer coated around the core and joined to the first pad;

the solder layer includes a bulge that spreads from the core of the connection member in a planar direction, the bulge being joined to the connection terminal of the electronic component;

the electronic component comprises a semiconductor chip that includes a semiconductor substrate having a circuit formation surface and an electrode terminal arranged on the circuit formation surface of the semiconductor substrate;

the semiconductor chip is mounted on the first substrate with a surface opposite to the circuit formation surface faced toward the first substrate; and the electrode terminal of the semiconductor chip functions as the connection terminal.

7. The wiring substrate according to claim 6, wherein the solder layer includes a straight rod portion which coats an upper half of the core, and the bulge of the solder layer is continuous with the straight rod portion and coats a lower half of the core.

8. A wiring substrate comprising:

a first substrate including an uppermost wiring layer;

a first pad formed on the uppermost wiring layer of the first substrate;

an electronic component mounted on an upper surface of the first substrate;

a connection terminal formed on the electronic component and located proximate to the first pad in a plan view; and a connection member formed on the first pad to electrically connect the first pad and the connection terminal, wherein:

the connection member includes a rod-shaped core, and a solder layer coated around the core and joined to the first pad;

the solder layer includes a bulge that spreads from the core of the connection member in a planar direction, the bulge being joined to the connection terminal of the electronic component;

the electronic component includes a semiconductor chip that includes a semiconductor substrate having a circuit formation surface and an electrode terminal arranged on the circuit formation surface of the semiconductor substrate;

the semiconductor chip is mounted on the first substrate with the circuit formation surface faced toward the first substrate; and the electrode terminal of the semiconductor chip functions as the connection terminal.

9. The wiring substrate according to claim 8, wherein the solder layer includes a straight rod portion which coats an upper half of the core, and the bulge of the solder layer is continuous with the straight rod portion and coats a lower half of the core.

* * * * *